(12) United States Patent
Ho et al.

(10) Patent No.: US 11,217,685 B2
(45) Date of Patent: Jan. 4, 2022

(54) HETEROJUNCTION BIPOLAR TRANSISTOR WITH MARKER LAYER

(71) Applicant: GLOBALFOUNDRIES U.S. INC., Santa Clara, CA (US)

(72) Inventors: Herbert Ho, New Winsdor, NY (US); Vibhor Jain, Williston, VT (US); John J. Pekarik, Underhill, VT (US); Claude Ortolland, Austin, TX (US); Judson R. Holt, Ballston Lake, NY (US); Qizhi Liu, Lexington, MA (US); Viorel Ontalus, Unionville, CT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 16/909,376

(22) Filed: Jun. 23, 2020

(65) Prior Publication Data

US 2021/0091214 A1    Mar. 25, 2021

Related U.S. Application Data

(60) Provisional application No. 62/904,342, filed on Sep. 23, 2019.

(51) Int. Cl.
*H01L 29/737* (2006.01)
*H01L 29/66* (2006.01)
*H01L 29/08* (2006.01)

(52) U.S. Cl.
CPC ........ *H01L 29/737* (2013.01); *H01L 29/0817* (2013.01); *H01L 29/66242* (2013.01)

(58) Field of Classification Search
CPC ............. H01L 29/737; H01L 29/66242; H01L 29/0817; H01L 29/0821; H01L 29/0649; H01L 29/1004; H01L 29/7371
See application file for complete search history.

(56) References Cited

U.S. PATENT DOCUMENTS

| | | |
|---|---|---|
| 7,087,940 B2 | 8/2006 | Khater et al. |
| 7,291,536 B1 | 11/2007 | Kalburge et al. |
| 7,566,921 B2 | 7/2009 | Pagette |
| 8,541,812 B2 | 9/2013 | Meunier-Beillard et al. |

(Continued)

FOREIGN PATENT DOCUMENTS

| | | |
|---|---|---|
| TW | 201842668 | 12/2018 |
| WO | 2012170219 | 12/2012 |

OTHER PUBLICATIONS

S. Van Huylenbroeck et al.,"A 400GHz fMAX Fully Self-Aligned SiGe:C HBT Architecture", IEEE Bipolar/BiCMOS Circuits and Technology Meeting (2009), 7 pages.

(Continued)

*Primary Examiner* — Syed I Gheyas
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a device with a marker layer and methods of manufacture. The device includes: a collector region; an intrinsic base region above the collector region; an emitter region comprising emitter material and a marker layer vertically between the intrinsic base region and the emitter material; and an extrinsic base region in electrical contact with the intrinsic base region.

20 Claims, 5 Drawing Sheets

(56) References Cited

U.S. PATENT DOCUMENTS

| | | |
|---|---|---|
| 8,932,931 B2 | 1/2015 | Faucher et al. |
| 10,347,737 B2 | 7/2019 | Dahl et al. |
| 2015/0194510 A1* | 7/2015 | Camillo-Castillo ........................ H01L 29/0821 257/586 |
| 2016/0043203 A1 | 2/2016 | Alperstein et al. |

OTHER PUBLICATIONS

Taiwanese Office Action and Search Report in related TW Application No. 109128588 dated Apr. 29, 2021, 8 pages.

\* cited by examiner

HETEROJUNCTION BIPOLAR TRANSISTOR WITH MARKER LAYER

FIELD OF THE INVENTION

The present disclosure relates to semiconductor structures and, more particularly, to a device with a marker layer and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications and require low collector-base capacitance (Ccb), low base resistance (Rb), high cut-off frequencies (fT/fMAX) and high breakdown voltage (BVceo).

In high performance Si/SiGe HBT technologies, the most common integration schemes involve forming an emitter inside of a hole etched into the extrinsic base layer. This results in complicated integration schemes for self-aligned emitter-base junction due to lack of an etch-stop layer for the extrinsic base etch during emitter formation. An emitter-before-extrinsic base integration architecture can resolve some of these issues but results in a non-self-aligned emitter base junction. Self-aligned schemes with emitter first face many challenges including, e.g., lack of an end-point signal for the emitter etch due to the sparse and varying emitter pattern and complicated process schemes to form spacers, which separate the emitter and the extrinsic base. Also, some integration schemes can result in high Ccb (parasitic capacitance) and high Rb, which is a concern in bipolar technologies as it limits device scaling for improved fT/fMAX.

SUMMARY

In an aspect of the disclosure, a structure comprises: a collector region; an intrinsic base region above the collector region; an emitter region comprising emitter material and a marker layer vertically between the intrinsic base region and the emitter material; and an extrinsic base region in electrical contact with the intrinsic base region.

In an aspect of the disclosure, a structure comprises: a collector region comprising a first semiconductor material formed over a substrate material acting as a subcollector region; an intrinsic base region above the collector region and comprising a second semiconductor material different than the first semiconductor material; an emitter region comprising emitter material, a marker layer and an intrinsic emitter material, the marker layer comprising material different than the second semiconductor material, the emitter material and the intrinsic emitter material; and a raised extrinsic base region in electrical contact with the intrinsic base region.

In an aspect of the disclosure, a method comprises: forming a collector material on a substrate; forming an intrinsic base material on the collector material; forming an etching marker layer over the intrinsic base material; forming an emitter material over the etching marker layer; patterning an emitter region to include at least the emitter material and the etching marker layer, stopping before getting to the intrinsic base material; forming sidewalls about the emitter region, including the emitter material and the etching marker layer; and forming an extrinsic base region in electrical contact with the intrinsic base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a device with a marker layer and methods of manufacture. More specifically, the device is a self-aligned heterojunction bipolar transistor which utilizes the marker layer as an end-point etch signal to prevent over-etching into intrinsic base material of the heterojunction bipolar transistor. In embodiments, the marker layer is a material that exhibits an etch selectivity to the base materials and, in some embodiments, intrinsic emitter materials of the heterojunction bipolar transistor. Advantageously, the present disclosure provides improved emitter-base junction control, in addition to exhibiting lower emitter resistance and lower emitter-base capacitance (Ceb).

In more specific embodiments, the heterojunction bipolar transistor includes a self-aligned emitter-base junction with a SiGe marker layer vertically between an emitter pedestal and the intrinsic emitter material. The SiGe marker layer can also be located horizontally between spacers of the heterojunction bipolar transistor, e.g., emitter pedestal. In embodiments, the marker layer is used to detect the completion of an emitter poly etching process used to form the emitter pedestal. The heterojunction bipolar transistor further includes a selectively grown epitaxial raised extrinsic base with a spacer formed along the sidewall of the intrinsic base, collector region and the epitaxial raised extrinsic base.

The marker layer can be a single crystalline material or polycrystalline material located below the extrinsic base material. The marker layer can be discontinuous around the emitter (e.g., emitter pedestal). For example, if the polycrystalline portion of the material is thicker than the single crystalline portion, the marker layer may be discontinuous at the emitter edge. Moreover, the marker layer can be SiGe or other materials that are selective to the intrinsic emitter material or intrinsic base material. For example, the marker layer can be SiC or SiCP. In this way, the marker layer will provide an end-point etch signal when patterning the emitter pedestal, thereby preventing gouging or otherwise affecting the intrinsic base material. In this way, a self-aligned emitter-base NPN with an emitter pedestal is formed by using the end-pointed etch with marker layer.

The device(s) of the present disclosure can be manufactured in a number of ways using a number of different tools. In general, though, the methodologies and tools are used to form structures with dimensions in the micrometer and nanometer scale. The methodologies, i.e., technologies, employed to manufacture the device(s) of the present disclosure have been adopted from integrated circuit (IC) technology. For example, the structures are built on wafers and are realized in films of material patterned by photolithographic processes on the top of a wafer. In particular, the fabrication of the device(s) uses three basic building blocks: (i) deposition of thin films of material on a substrate, (ii) applying a patterned mask on top of the films by photolithographic imaging, and (iii) etching the films selectively to the mask.

Figure 1:
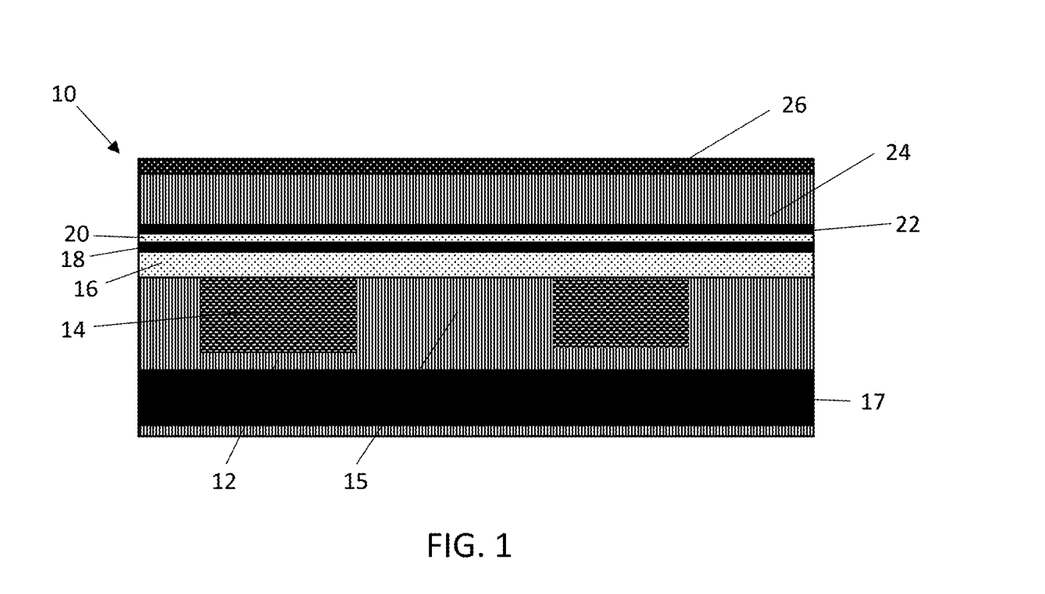
FIG. 1 shows a substrate with a marker layer, amongst other features, and respective fabrication processes in accordance with aspects of the present disclosure.

FIG. 1 shows a substrate with a marker layer, amongst other features, and respective fabrication processes in accordance with aspects of the present disclosure. More specifically, the structure 10 of FIG. 1 includes a substrate 12 composed of semiconductor material and, preferably, bulk Si material. The substrate 12 can be lightly doped with n-type dopants, e.g., phosphorus or arsenic, to define a collector region 15 of the device. Moreover, the substrate can include a N+ doped sub-collector region 17 in which the N+ doped sub-collector region is a very high dose implant including As and/or P and/or Sb, as should be understood by those of skill in the art such that no further explanation is required herein. In any of the embodiments, the substrate 12 may be composed of any suitable material including, but not limited to, Si (e.g., single crystalline Si), SiGe, SiGeC, SiC, GaAs, InAs, InP, and other III/V or II/VI compound semiconductors.

In embodiments, the substrate 12 can be a local bulk substrate formed in silicon on insulator technology (SOI). In embodiments, the SOI technology includes an insulator layer on top of a semiconductor layer and another semiconductor layer (e.g., single crystalline Si), on top of the insulator layer. The insulator is formed by any suitable process such as separation by implantation of oxygen (SIMOX), oxidation, deposition, and/or other suitable process. An exemplary insulator layer may be a buried oxide layer (BOX). The semiconductor layer on top of the insulator layer can be fabricated using wafer bonding, and/or other suitable methods. The substrate 12 can be formed within the SOI technology using conventional lithography and etching techniques to form a trench, followed by deposition of bulk substrate material within the trench.

Still referring to FIG. 1, shallow trench isolation structures 14 are formed in the substrate 12 using conventional lithography, etching and deposition processes. The shallow trench isolation structures 14 will define the collector region 15 of the device. By way of example in forming the shallow trench isolation structures 14, a resist formed over the substrate 12 is exposed to energy (light) to form a pattern (opening). An etching process with a selective chemistry, e.g., reactive ion etching (RIE), will be used to form one or more trenches in the substrate 12, through the openings of the resist. Following the resist removal by oxygen ashing process or other known stripants, insulator material (e.g., $SiO_2$) can be deposited within the trenches by any conventional deposition processes, e.g., chemical vapor deposition (CVD) processes. Any residual material on the surface of the substrate 12 can be removed by conventional chemical mechanical polishing (CMP) processes.

FIG. 1 further shows a collector material 16 on the substrate 12 and the shallow trench isolation structures 14. The collector material 16 can be a doped n-type material or an undoped material, formed using an epitaxial growth process with in-situ dopant process. In embodiments, the collector material 16 can be any semiconductor material, e.g., Si material, and preferably is a single crystalline Si material; although other semiconductor materials are contemplated herein. Doping and thickness of the collector material 16 can be tuned for desired device performance. As should be understood by those of skill in the art, the collector material 16 will form as polycrystalline material over the shallow trench isolation structures 14.

FIG. 1 further shows a base material (e.g., intrinsic base region) 18 formed on the collector material 16. In embodiments, the base material 18 is an intrinsic base region composed of epitaxial material. For example, the base material 18 can be composed of undoped semiconductor material, e.g., SiGe material. In embodiments, the semiconductor material 18 can also be n-type doped materials (for PNP transistor) or p-typed doped materials (for NPN transistor). As with the collector material 16, the base material 18 can be single crystalline semiconductor material formed by conventional epitaxial growth processes with optional in-situ doping (or ion implantation processes). And, as should be understood by those of ordinary skill in the art, the base material 18 will grow as a polycrystalline material over the shallow trench isolation structures 14.

Still referring to FIG. 1, a semiconductor material 20, e.g., Si, is deposited on the base material 18. In embodiments, the semiconductor material 20 is an epitaxially grown intrinsic emitter material. A marker layer 22 is epitaxially grown on the semiconductor material 20. An emitter material 24 is formed above the marker layer 22, with a capping material 26, e.g., SiN, deposited on the emitter material 24.

In embodiments, the marker layer 22 is an epitaxially grown material that has an etch selectivity to the emitter material 24 and the intrinsic emitter material 20. For example, the marker layer 22 can be SiGe material; whereas, the emitter material 24 and intrinsic emitter material 20 can be Si material. In embodiments, the emitter material 24 can be an arsenic doped material formed by an in situ growth process. In alternative embodiments, the marker layer 22 can be SiC, SiCP or an oxide material, as examples. Also, it should be recognized that the marker layer 22 will grow as polycrystalline material outside the single crystal region and can have a thickness different from the single crystal region.

In any of the examples, the marker layer 22 can have a thickness less than the semiconductor materials 18, 20, and will act as an etch stop detection layer preventing gouging into the intrinsic base material 18 during an etching process, e.g., RIE, used to form an emitter pedestal. For example, a trace signal, e.g., optical emission signal, will be used to clearly identify the marker layer during the etching process, indicating a stop to the etching process. Accordingly, the marker layer 22, e.g., SiGe material, will provide a signal that can be used as a robust endpoint signal to control the etch of emitter region.

Figure 2A:
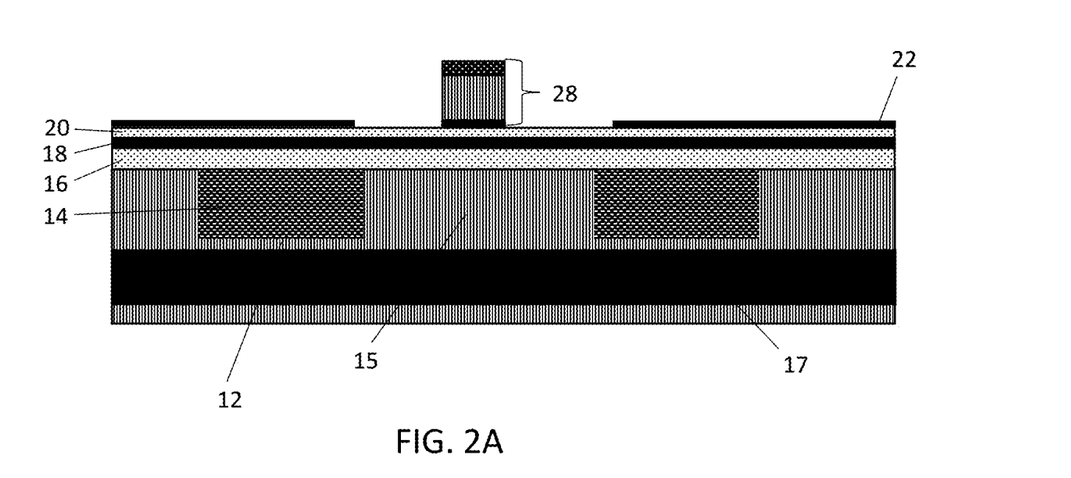
FIG. 2A shows an emitter pedestal with a discontinuous marker layer, amongst other features, and respective fabrication processes in accordance with aspects of the present disclosure.
Figure 2B:
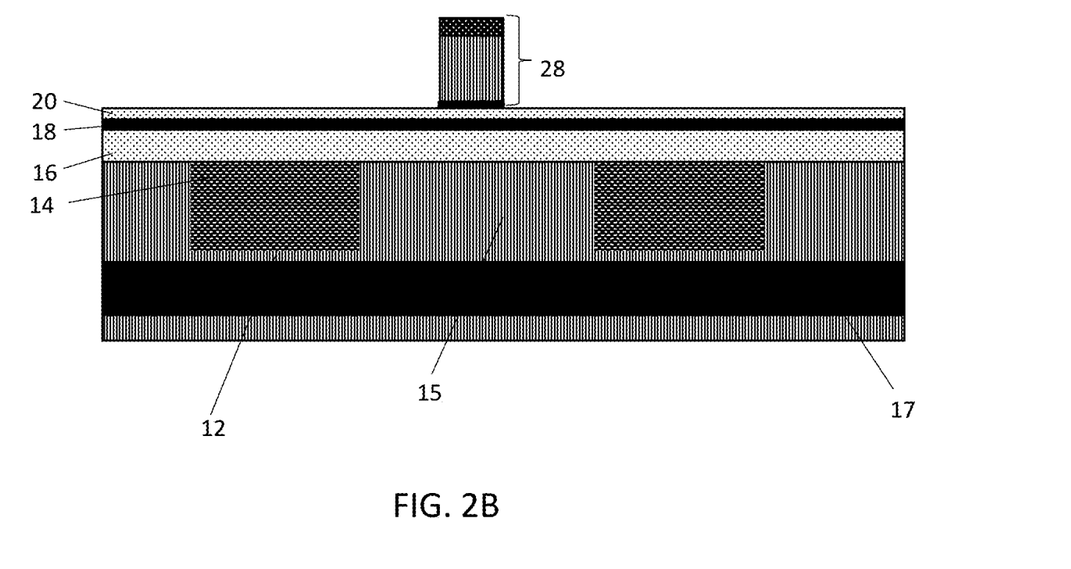
FIG. 2B shows an emitter pedestal with a marker layer, amongst other features, and respective fabrication processes in accordance with aspects of the present disclosure.

FIGS. 2A and 2B show an emitter pedestal 28 (e.g., emitter region), amongst other features, and respective fabrication processes. In embodiments, the emitter pedestal 28 is composed of the nitride cap layer 26, emitter material 24, the marker layer 22 and the intrinsic emitter material 20. The emitter pedestal 28 is formed by an etching process which removes portions of the nitride cap layer 26, emitter material 24 and, in optional embodiments, the marker layer 22 as described in more detail below. The emitter pedestal 28 can be patterned into different shapes, e.g., a rectangular, round, octagonal or other shape. As shown in FIG. 2B, in removing the marker layer 22, the underlying intrinsic emitter material 20 will be exposed; however, the etch process will not gouge into the intrinsic base material 18 as the marker layer 22 will provide a trace signal indicating that the etching should stop preferably at the marker layer 22.

FIG. 2A shows the emitter pedestal 28 and a discontinuous marker layer 22; whereas, FIG. 2B shows the marker layer 22 removed from outside of the emitter pedestal 28. For example and by way of more detailed explanation, as shown in FIG. 2A, should the polycrystalline portions be thicker than the single crystalline portion of the marker layer 22, the marker layer 22 may be discontinuous at the edge of the emitter pedestal 28; that is, the single crystalline portion of the marker layer 22 will be etched away at the edge of the emitter pedestal 28 and the polycrystalline portion of the marker layer 22 further away will remain on the material 20. This is due to the different thickness of the poly material and the single crystalline material, e.g., poly material is thicker than the single crystalline material. On the other hand, should the polycrystalline portion be thinner than the single crystalline portion, the marker layer 22 (e.g., SiGe) will be completed etched outside of the emitter pedestal 28 as shown in FIG. 2B.

Figure 3:
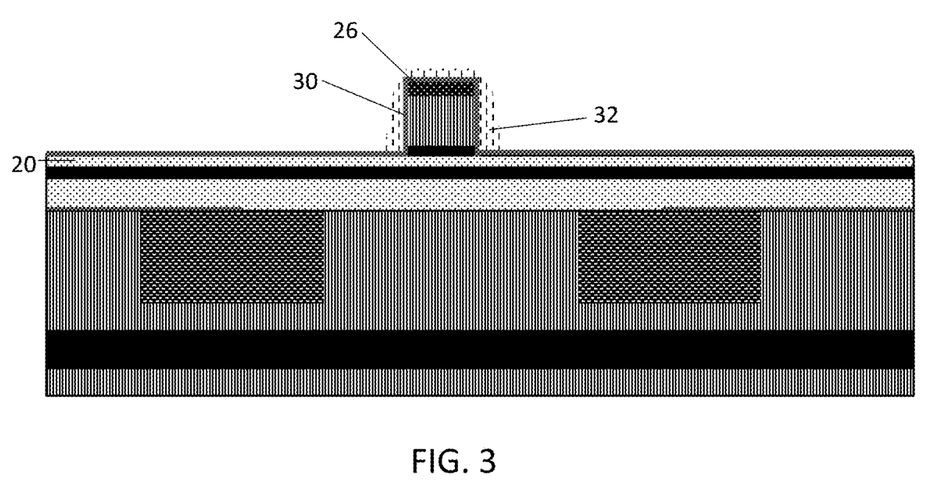
FIG. 3 shows spacer materials formed on the emitter pedestal, amongst other features, and respective fabrication processes in accordance with aspects of the present disclosure.

In FIG. 3, spacer materials 30, 32 are formed on the emitter pedestal 28. More specifically, an insulator material 30, e.g., oxide material, is blanket deposited over the emitter pedestal 28 and exposed base material 20. Another insulator material 32, different from the insulator material 30, is deposited over the insulator material 30. In embodiments, the insulator material 30 is an oxide material and the insulator material 32 is nitride material. Following the deposition of the insulator materials 30, 32, the insulator material 32 will undergo an etching process, e.g., anisotropic etching process, to remove the insulator material 32 over a top of the emitter pedestal 28 and the insulator material 30 over the intrinsic emitter material 20. This etching process will leave insulator material 32, e.g., nitride material, on sidewalls of the emitter pedestal 28 (with the marker layer between the sidewalls).

Figure 4:
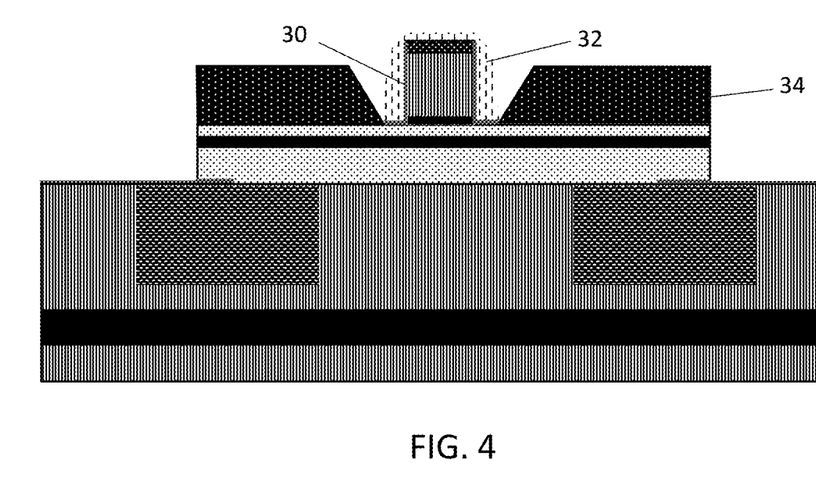
FIG. 4 shows an extrinsic base formed on exposed base material, amongst other features, and respective fabrication processes in accordance with aspects of the present disclosure.

FIG. 4 shows an extrinsic base 34 formed on the exposed intrinsic emitter material 20. More specifically, in FIG. 4, the insulator material 30 is removed to expose the intrinsic emitter material 20. The insulator material 30 can be removed by a pre-epi oxide etch, e.g., SiCoNi or Chemical Oxide Removal (COR). A semiconductor material 34 is grown on the exposed intrinsic emitter material 20 to form a raised extrinsic base region. In embodiments, the semiconductor material 34 can be Si or SiGe material or a combination of two. In more specific embodiments, the semiconductor material 34 is p-doped Si or SiGe material. The p-dopant can be boron formed in an in situ growth process, as already described herein. This results in the formation of a self-aligned emitter base junction with the emitter 24 separated from the extrinsic base layer 34 by spacer material 30, 32. Following the growth process, the semiconductor materials 16, 18, 20, 34 undergo a patterning process define the extrinsic base and expose the underlying substrate material 12 used as a collector contact area.

Figure 5:
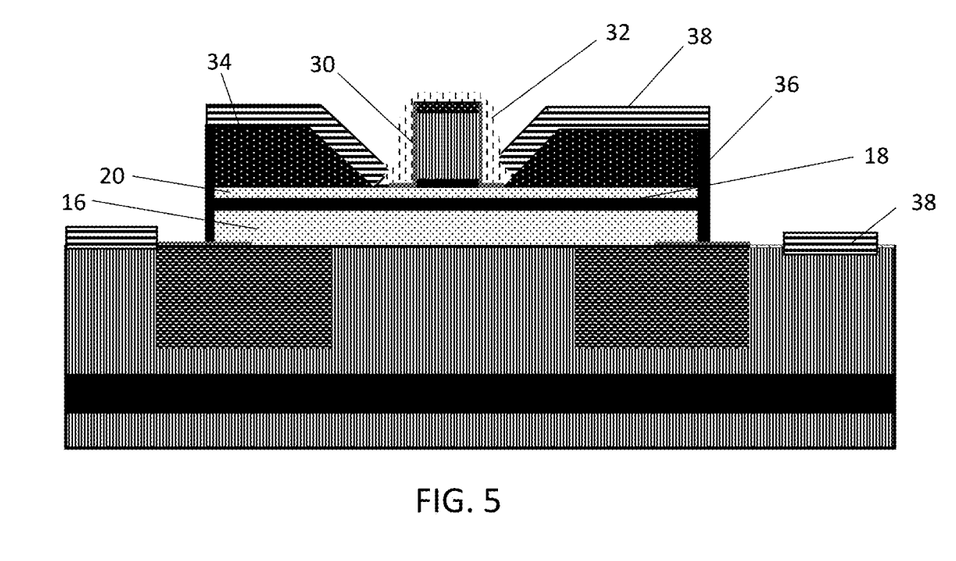
FIG. 5 shows suicide contacts, amongst other features, and respective fabrication processes in accordance with aspects of the present disclosure.

FIG. 5 shows silicide contacts 38, amongst other features, and respective fabrication processes. Prior to the silicide process, a spacer material 36 is formed on exposed edges or sidewalls of the patterned semiconductor materials 16, 18, 20, 34, e.g., patterned extrinsic base region. In embodiments, the spacer material 36 can be a nitride material blanket deposited on the structure, followed by an anisotropic etching process. The anisotropic etching process will leave the spacer material 36 on the exposed edges of the semiconductor materials 16, 18, 20, 34.

As further shown in FIG. 5, the silicide contacts 38 are provided on the exposed semiconductor material of the substrate 12 (e.g., in electrical contact with the sub-collector region 15) and the extrinsic base 34. In embodiments, the silicide process begins with deposition of a thin transition metal layer, e.g., nickel, cobalt or titanium, over fully formed and patterned semiconductor material. After deposition of the material, the structure is heated allowing the transition metal to react with exposed silicon (or other semiconductor material as described herein) forming a low-resistance transition metal silicide contacts 38. Following the reaction, any remaining transition metal is removed by chemical etching, leaving silicide contacts 38.

Figure 6:
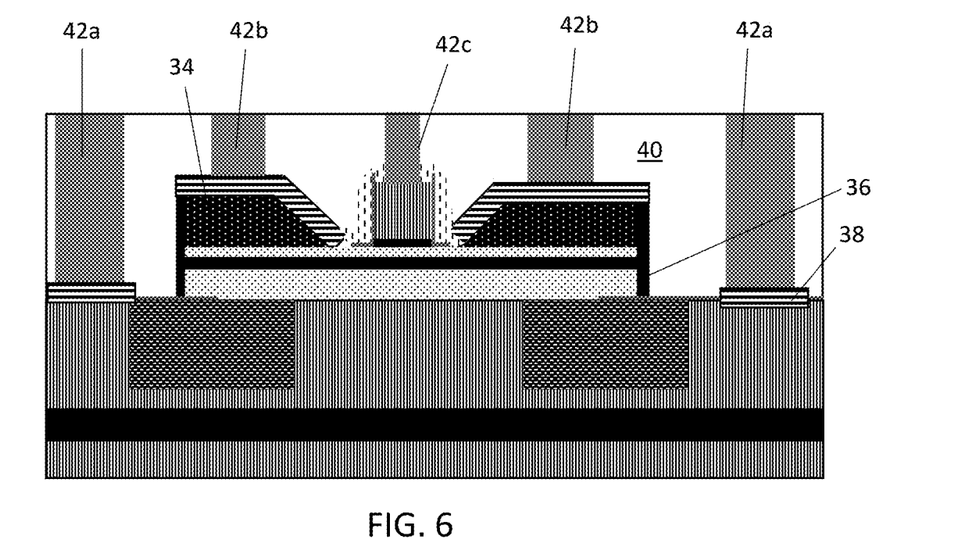
FIG. 6 shows contacts formed to the emitter pedestal, extrinsic base and a sub-collector region of FIG. 5, and respective fabrication processes in accordance with aspects of the present disclosure.

FIG. 6 shows contacts formed to the emitter pedestal 28, extrinsic base 34 and a sub-collector region 15, i.e., substrate 12, of FIG. 5. Specifically, a dielectric material 40 is deposited over the structure, followed by a lithography, etching and deposition processes (e.g., metallization process). For example, the dielectric material 40 is deposited by a CVD process, followed by the lithography and etching (e.g., RIE) processes to form trenches within the dielectric material 40. A metal material, e.g., aluminum or tungsten, is deposited within the trenches to form the collector contacts 42a, the extrinsic base contact 42b and the emitter region contact 42c. Any residual metal material can be removed from the surface of the dielectric material 40 by a conventional chemical mechanical planarization process.

Figure 7:
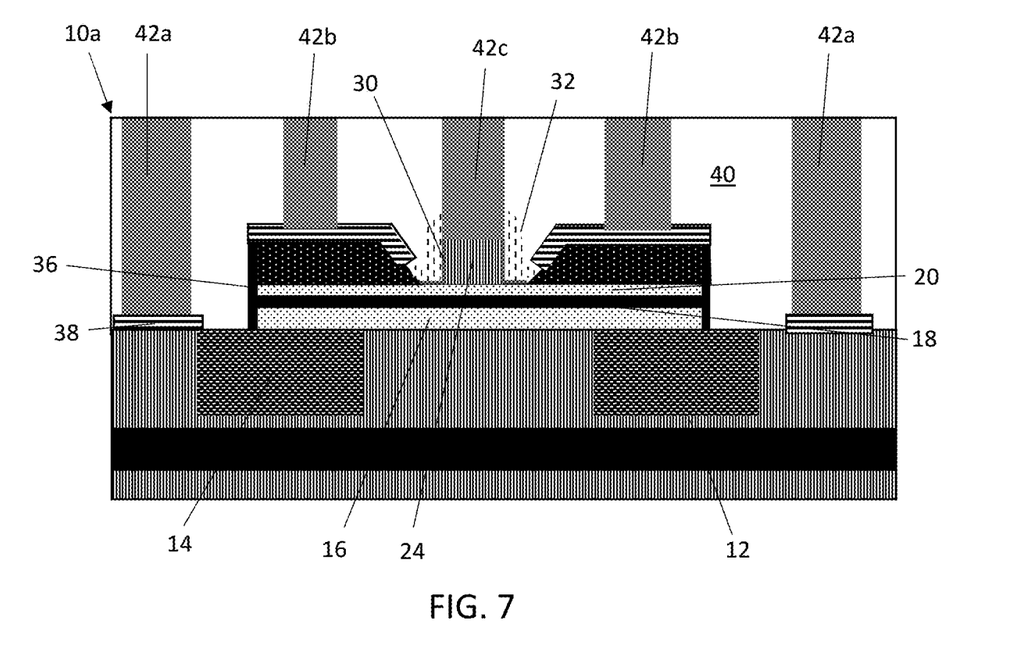
FIG. 7 shows a heterojunction bipolar transistor in accordance with additional aspects of the present disclosure.

FIG. 7 shows a heterojunction bipolar transistor 10a in accordance with additional aspects of the present disclosure. In the heterojunction bipolar transistor 10a shown in FIG. 7, the intrinsic emitter material 20 can be used as the marker layer to stop the etching process on the intrinsic base material 18. For example, as already noted herein, the intrinsic base material 18 can be composed of undoped semiconductor material, e.g., SiGe material; whereas, the intrinsic emitter material 20 can be Si material. In this way, it is possible to eliminate the need for the marker layer 22.

The devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a collector region;
an intrinsic base region above the collector region;
an emitter region comprising emitter material and a marker layer vertically between the intrinsic base region and the emitter material;
an extrinsic base region in electrical contact with the intrinsic base region; and
a spacer on sidewalls of the intrinsic base region including the extrinsic base region, remote from the emitter region.

2. The structure of claim 1, wherein the marker layer has an etch selectivity to both the emitter material and semiconductor material directly underneath the marker layer.

3. The structure of claim 2, wherein the marker layer is SiGe material.

4. The structure of claim 2, further comprising an intrinsic emitter material between the marker layer and the emitter material.

5. The structure of claim 2, wherein the marker layer is between spacers on sides of the emitter region.

6. The structure of claim 2, wherein the extrinsic base region is a raised base region composed of epitaxially grown material.

7. The structure of claim 2, wherein the marker layer is single crystal or polycrystalline material.

8. The structure of claim 2, wherein the marker layer is discontinuous about the emitter region.

9. The structure of claim 8, wherein the marker layer is below the extrinsic base material composed of polycrystalline material.

10. The structure of claim 1, further comprising contacts to the emitter material, the extrinsic base region and in electrical contact to the collector region through a substrate material.

11. The structure of claim 1, wherein the marker layer has an etch selectivity to the emitter material and the extrinsic base region is a raised base region composed of epitaxial semiconductor material.

12. A structure comprising:
a collector region comprising a first semiconductor material formed over a substrate material acting as a subcollector region;
an intrinsic base region above the collector region and comprising a second semiconductor material different than the first semiconductor material;
an emitter region comprising emitter material, a marker layer and an intrinsic emitter material, the marker layer comprising material different than the second semiconductor material, the emitter material and the intrinsic emitter material; and
a raised extrinsic base region in electrical contact with the intrinsic base region.

13. The structure of claim 12, wherein the marker layer is SiGe material which has an etch selectivity to the intrinsic emitter material.

14. The structure of claim 12, wherein the marker layer is vertically between the emitter material and the intrinsic base material and is laterally bounded by spacer material on sides of the emitter region.

15. The structure of claim 12, further comprising a spacer on sidewalls of the raised extrinsic base region.

16. The structure of claim 12, wherein the marker layer is single crystal or polycrystalline material.

17. The structure of claim 12, wherein the marker layer is discontinuous about the emitter region.

18. The structure of claim 12, wherein an emitter-base junction of the emitter region and the raised extrinsic base material is self-aligned.

19. The structure of claim 12, wherein the first semiconductor material is Si material and the second semiconductor material is SiGe material, separated from the marker layer by the intrinsic emitter material.

20. A method comprising:
forming a collector material on a substrate;
forming an intrinsic base material on the collector material;
forming an etching marker layer over the intrinsic base material;
forming an emitter material over the etching marker layer;
patterning an emitter region to include at least the emitter material and the etching marker layer, stopping before getting to the intrinsic base material;
forming sidewalls about the emitter region, including the emitter material and the etching marker layer; and
forming an extrinsic base region in electrical contact with the intrinsic base region.

* * * * *